ELECTRICAL INTERCONNECTIONS

Filed Jan. 27, 1965

Samuel R. Shortes
INVENTOR.
BY John G. Graham
ATTORNEY

United States Patent Office 3,323,198
Patented June 6, 1967

3,323,198
ELECTRICAL INTERCONNECTIONS

Samuel R. Shortes, Dallas, Tex., assignor to Texas Instruments Incorporated, Dallas, Tex., a corporation of Delaware Filed Jan. 27, 1965, Ser. No. 428,447
7 Claims. (Cl. 29—155.5)

ABSTRACT OF THE DISCLOSURE

Disclosed are methods for forming electrical interconnections through a substrate composed of a compound having one volatile element utilizing a high energy source to volatilize the more volatile element from a portion of the substrate and forming an electrical interconnection passing through the hole formed thereby. Also disclosed are embodiments of products produced by the processes.

This invention relates to a method of making electrical interconnections in compound semiconductors. More particularly, it relates to a method of interconnecting function-performing regions within a crystalline body to other function-performing regions within or on the surface of said body to form semiconductor networks or integrated circuits.

Integrated circuits are electrical devices generally comprising a plurality of circuit components which perform individual electrical functions, such as those performed, for example, by diodes, transistors, resistors, capacitors, etc. These components are fabricated on or within a small crystalline semiconductor wafer and interconnected to form an electrical circuit. The term "electrical device" as used herein includes devices which provide one or more circuit component functions, complete circuit functions, or complete system or network functions. Such electrical devices are described in copending application "Three-Dimensional Integrated Circuits and Methods of Making Same," Serial No. 390,298, filed August 18, 1964, in the names of Robert W. Haisty, Rowland E. Johnson and Edward W. Mehal and assigned to the assignee of the instant application.

Heretofore, electrical devices integrally formed on opposite sides of an insulating substrate could only be interconnected with extreme difficulty by such means as wires attached to both devices and extending around the edge of the substrate, or metallic conductive films evaporated in such a way as to wrap around the edges of the substrate to interconnect the two devices.

This invention provides a novel method of producing electrical interconnection of devices separated by an insulating substrate by advantageously utilizing a characteristic of compound semiconductors which is generally considered to be a severe limitation on the use of such material. As used herein the term "insulating" material means material having a resistivity at room temperature of about $10^4$ ohm-cm. or greater and includes materials such as "intrinsic-appearing," "semi-insulating," and "high resistivity" gallium arsenide.

One of the well known problems associated with compound semiconductor materials is their tendency to dissociate into constituent elements, particularly such compounds as the Group III–V and Group II–VI compounds in which one of the elements is usually highly volatile. Consequently, when heated these compounds tend to dissociate into their constituent elements, the more volatile element evaporating and leaving a layer of the metallic, less volatile element.

The present invention advantageously utilizes the above-described dissociation to provide electrical interconnections between device regions on opposite sides of an insulating compound semiconductor substrate. By restricting dissociation to a small area of the surface of a compound semiconductor body, a small hole can be propagated through the body. The hole is the result of the localized loss of the more volatile element. The more metallic, less volatile element is left to coat the surface of the material surrounding the hole and provide a conductive metallic film electrically interconnecting opposite sides of the substrate.

Accordingly, the present invention provides a method of interconnecting electrical devices on opposite sides of an insulating substrate by means of a conductive film coating the inner surface of a hole extending through the substrate.

It is therefore an object of the present invention to provide electrical interconnections between semiconductive or metallic regions separated by an insulating region.

It is another object of the invention to provide a means of producing electrically conductive regions which extend through an insulating body.

It is a further object of this invention to provide a method of interconnecting electrical device function-performing regions disposed entirely within the confines of an insulating or semi-insulating block.

It is a further object of the invention to provide a method of forming expanded contacts to semiconductor regions protected by oxide films.

Still a further object of the invention is to provide a method of interconnecting mutually isolated co-planar conductive regions formed on one side of a substrate.

These and other objects and advantages of the invention will become more readily understood from the following detailed description, taken in conjunction with the appended claims and attached drawing in which:

Figures 4, 5:
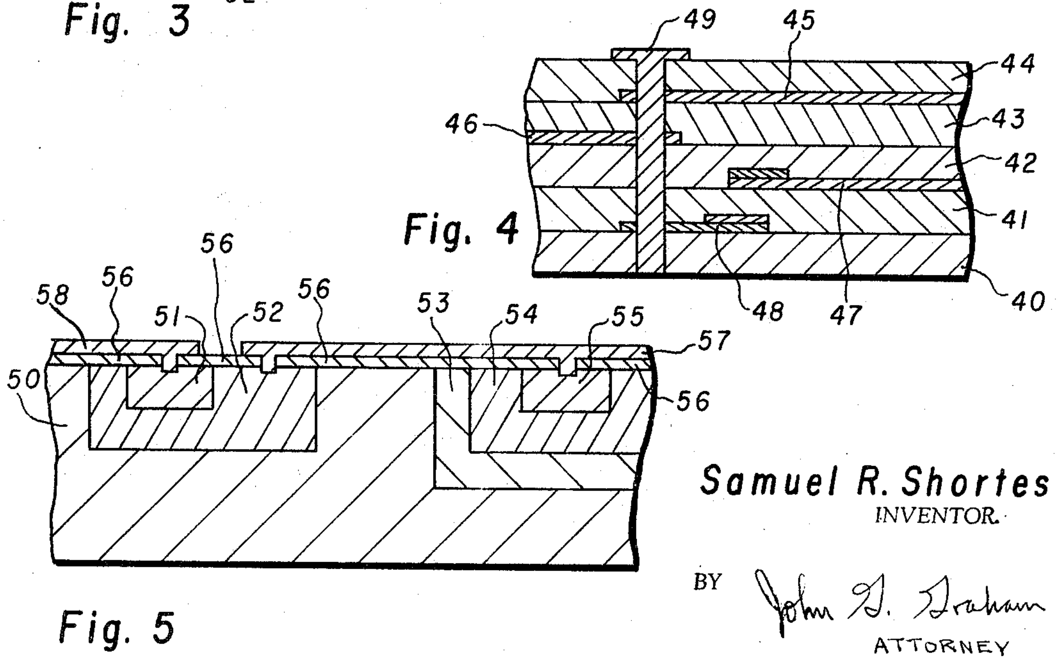

FIGURE 4 is a fragmentary sectional view of a three-dimensional integrated circuit wafer showing electrical interconnection between selected device function-performing regions; and FIGURE 5 is a fragmentary sectional view of a semiconductor wafer having a planar diode and a planar transistor formed in one surface thereof and interconnected by a metallic layer electrically isolated from the body of the semiconductor wafer except at the desired points of interconnection.

Dimensions of certain of the parts as shown in the drawing have been modified and/or exaggerated for the purpose of clarity of illustration.

Figure 1:
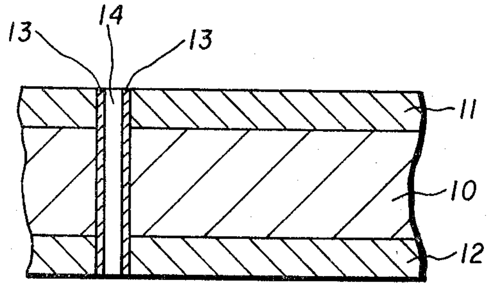
FIGURE 1 is a fragmentary sectional view of a semi-insulating wafer having conducting regions on both sides thereof electrically interconnected by a thin conductive metallic film coating the wall of a hole passing through the substrate and conductive regions.

Referring specifically to FIGURE 1, there is shown a semi-insulating substrate 10 having conductive layers 11 and 12 formed on opposite sides thereof. Substrate 10 may be, for example, semi-insulating or high resistivity gallium arsenide or any other compound formed of a metallic and a highly volatile element. Conductive layers 11 and 12 may be formed, for example, by epitaxial deposition of material of the same crystalline structure on the surface of substrate 10 or by diffusion of conductivity-affecting impurities into the surface of substrate 10 to form a conductive or semi-conductive region therein. Electrical interconnection of layers 11 and 12 is accomplished by means of a thin metallic layer 13 which coats the walls of a hole 14 which passes through layer 11, substrate 10, and layer 12. It will be noted that the metallic coating 13 is electrically connected with both layers 11 and 12 and passes transversely through the body of substrate 10.

In the preferred embodiment of the invention, very small and uniform holes such as the hole 14 are formed in the compound material by causing localized dissociation of the compound by rapid heating with a beam of high energy electrons. The required beam of high energy electrons may be provided by conventional electron beam equipment, such as the Zeiss Electron Beam Milling Machine Type BFN 100 W. The electron beam may be readily focused to 0.25 mil diameter. Under the intense heat caused by the electron beam impinging on a 0.25 mil diameter spot on the surface of the substrate, the substrate decomposes.

It will be noted that the holes are formed by localized decomposition, not by melting. Thus the substrate material decomposes locally, the exposed portion dissociating into its constituent elements.

It has been found, for example, that gallium arsenide readily dissociates when bombarded with an electron beam of 212 watts/mil$^2$. At this power dissipation the gallium arsenide is decomposed very rapidly, and, due to the low thermal conductivity of gallium arsenide, the gallium arsenide body surrounding the exposed region is not appreciably heated. The liberated arsenic evaporates instantly, carrying with it some of the liberated gallium. The remaining gallium, having an extremely low vapor pressure, does not vaporize but flows along the walls of the holes as they are formed and thus provides a thin metallic coating extending transversely through the body of the substrate.

Hole 14 may be made as small as one-fourth of a mil in diameter (0.00025 inch) and essentially uniform and untapered through a gallium arsenide wafer 25 mils thick by focusing a beam of high energy electrons on a small portion of a surface as described above.

Figure 2:
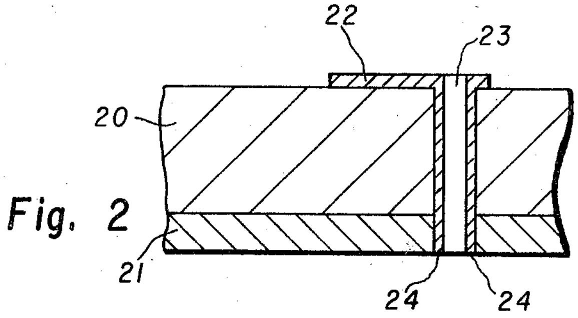
FIGURE 2 is a fragmentary sectional view of an insulating substrate having a conductive region on one surface thereof and a hole passing therethrough which has its surface coated with a metallic conductor to provide electrical communication between the conductive surface and the semi-insulating surface.

In FIGURE 2 is shown an insulating compound substrate 20 having a conductive layer 21 on one surface thereof. A thin layer 22 of a conductive metal, for example gold, is deposited on a restricted area of the surface of wafer 20. A hole 23 passing through metal layer 22, substrate 20 and conductive layer 21 is formed by focusing a beam of high energy electrons, as described above, on the surface of the metal layer 22. The high energy electron beam melts and evaporates that portion of metal layer 22 on which it impinges, and heats a localized portion of the underlying compound substrate 20 to cause it to dissociate. As the substrate dissociates, hole 23 is propagated transversely through the body of substrate 20 and layer 21. Due to conductive heating, metal layer 22 becomes partially molten and the liquid metal flows down the hole 23 formed by the electron beam as it is formed. In this manner conductive layer 24 is formed on the walls of hole 23 to provide electrical connection between layer 21 and metallic layer 22. Thus it will be seen that leads could be easily attached to layer 22 to provide electrical connection to external circuitry and such leads would not obstruct layer 21. Similarly, integrated circuitry or printed circuit components on the top surface of substrate 20 may easily be electrically connected with layer 21.

Figure 3:
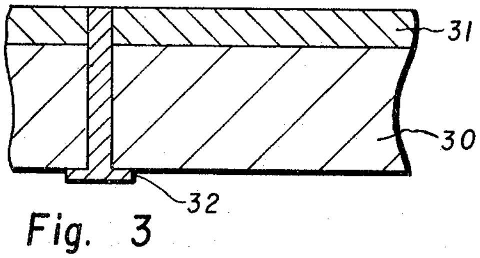
FIGURE 3 is a fragmentary sectional view of a semi-insulating wafer having a conductive region on one side thereof which has electrical communication to the opposite side thereof by means of a conductive post extending through the semi-insulating substrate and the conductive region.

FIGURE 3 shows an insulating compound substrate 30 having a conductive layer 31 on one surface thereof and a metallic post 32 extending transversely through the body of wafer 30 and layer 31. Conductive post 32 is formed by first drilling or machining a hole through wafer 30 and layer 31, as described above with reference to FIGURE 1, and thereafter masking the surface of wafer 30 so as to expose only a small portion thereof adjacent the hole passing therethrough. A metallic conductor 32, such as gold, is then evaporated through the mask to fill the hole and provide electrical connection between layer 31 and the opposite surface of wafer 30.

A method of interconnecting two or more electrical devices disposed entirely within the confines of a matrix of insulating or semi-insulating material is shown in FIGURE 4. The semi-insulating body is comprised of layers 40, 41, 42, 43 and 44 of semi-insulating material epitaxially deposited or otherwise formed to produce a layered structure which incorporates conductive regions 45 and 46 and electrical devices 47 and 48 within the confines of the body. Conductive regions 45 and 46 may be, for example, lateral conductive interconnections between discrete electrical devices within a single stratum of a multilayered block. Conductive regions 45 and 46 and electrical device 48 are disposed in the body in super-imposed strata such that a post 49 passing transversely through the body intersects and provides electrical connection with a portion of each of conductive region 45, conductive region 46, and electrical device 48.

To interconnect each of the regions 45 and 46, a hole is drilled through the body, as described above with reference to FIGURE 1, and a conductive post 49 deposited and formed in the hole, as described with reference to FIGURE 3. Thus conductive post 49 electrically interconnects regions 45 and 46 with electrical device 48. It will be noted that, although electrical device 48 and regions 45 and 46 are disposed entirely within the confines of a body of semi-insulating material, an electrical interconnection is provided which communicates not only between the electrical device 48 and the conductive regions 45 and 46, but also the surface of the body. Thus external connections may be connected to the expanded portion of electrically conductive post 49. It should also be noted that electrical interconnection could be provided by the method described with reference to FIGURE 1.

Another embodiment of the invention is shown with reference to FIGURE 5 which shows an insulating substrate 50 having diffused regions 51, 52, 53, 54 and 55 formed therein as planar devices under a protective silicon oxide film 56. Diffused regions 51 and 52 are of opposite conductivity-type and thus represent a conventional planar diffused diode. Likewise, diffused regions 53, 54 and 55 are of alternate conductivity-type, thus forming either an N-P-N or P-N-P diffused planar transistor. Electrical interconnection is provided between diffused region 55 and diffused region 52 by means of a thin conductive layer 57 overlying part of the surface of protective silicon oxide layer 56 and filling holes in said silicon oxide layer which expose parts of the diffused layers to be electrically interconnected. The silicon oxide layer 56 insulates conductive layer 57 from all the diffused layers except 52 and 55.

A beam of high energy electrons, such as described above, is used to form a small hole in the silicon oxide layer 56 and allowed to penetrate slightly into the surface of the underlying semiconductor. Thereafter, electrically conductive layer 57 is deposited over the surface of insulating silicon oxide layer 56 to form electrical interconnection between diffused layer 52 and diffused layer 55. Likewise, conductive layer 58 is electrically connected with diffused region 51. It will be noted that this method of interconnection not only provides planar interconnection between devices formed in a co-planar surface of a substrate, but also provides expanded metal contacts to which external leads may be readily attached.

In the embodiment described above, holes are formed in a compound substrate by localized dissociation of the compound under bombardment by high energy electrons. The electron bombardment is usually performed in a high vacuum chamber. However, it has also been discovered that similar results can be obtained with much lower energy electron beams. A low energy electron beam which does not have sufficient energy to cause localized dissociation of the substrate may be used in an evacuated chamber containing a slight amount of a halogen-containing gas to accomplish similar results. The low energy electron beam bombardment apparently weakens the crystalline structure of the substrate without causing dissociation and the halogen gas reacts preferentially with the weakened crystalline structure to preferentially etch the substrate. In this manner essentially clean untapered holes may be formed in substrates very rapidly and without heating.

It is to be understood that the above-described embodiments of the invention are merely illustrative of the principles of the invention. Numerous other arrangements and modifications may be derived from those skilled in the art without departing from the spirit and scope of the invention as defined by the appended claims.

What is claimed is:

1. The method of making holes in compound materials selected from the group consisting of Group II–VI and Group III–V compounds susceptible to dissociation by heat, comprising the steps of heating a localized portion of said material to cause said material to dissociate in said localized portion, maintaining said heat on said localized portion for a period of time sufficient for vaporizing the more volatile constituent from said localized area thereby to cause a hole to be propagated through the thickness of said material.

2. The method of making electrically conductive connections between discrete semiconductor regions disposed within the crystalline lattice of an electrically insulating matrix constituted of a material susceptible to dissociation by heat comprising the steps of heating a localized portion of said matrix to cause said matrix to dissociate in said localized portion, maintaining said heat on said localized portion for a period of time sufficient for vaporizing the more volatile constituent from said localized portion thereby to cause a hole to be propagated through the thickness of said matrix and through selected portions of said semiconductor regions in the path of said hole and to cause the wall of said hole to become coated with the less volatile constituent of said matrix.

3. The method of making electrical interconnections between discrete regions disposed within the crystalline lattice of a body of semi-insulating gallium arsenide comprising the steps of heating a localized portion of said semi-insulating gallium arsenide to cause said gallium arsenide to dissociate in said localized portion, maintaining said heat on said localized portion for a period of time sufficient for vaporizing arsenic from said localized area, thereby to cause a hole to be propagated through the thickness of said gallium arsenide and through said discrete regions, leaving a layer of gallium coating the walls of the hole.

4. The method of making an electrically conductive region in a body of insulating material selected from the group consisting of Group II–VI and Group III–V compounds comprising the step of heating a localized portion of said insulating material by bombardment with a beam of high energy electrons, said beam of high energy electrons being sufficient to cause dissociation of said material in said localized region and evaporation of the more volatile constituent of said insulating compound to form a hole and to cause the wall of said hole to become coated with the less volatile constituent of said insulating material, said less volatile constituent forming said electrically conductive region.

5. The method of electrically interconnecting a plurality of semiconductor regions contiguous with a subtrate of high resistivity gallium arsenide electrically separating said semiconductor regions comprising the step of heating a localized portion of said gallium arsenide substrate with an electron beam of about 212 watts/mil$^2$ for a period of time sufficient to cause dissociation of said gallium arsenide substrate and evaporation of arsenic therefrom, leaving a conductive layer of gallium passing transversely through said gallium arsenide substrate and a plurality of semiconductor regions contiguous with said gallium arsenide substrate.

6. The method of making an electrically conductive connection between discrete semiconductor regions disposed within the crystalline lattice of an electrically insulating matrix constituted of a material susceptible to dissociation by heat, comprising the steps of heating a localized portion of said matrix to cause said matrix to dissociate in said localized portion, maintaining said heat on said localized portion for a period of time sufficient for vaporizing the more volatile constituent from said localized portion, thereby to cause a hole to be propagated through the thickness of said matrix and through selected portions of said semiconductor regions in the path of said hole and to cause the wall of said hole to become coated with the less volatile constituent of said matrix, and filling said hole with an electrically conductive material.

7. A method of making an electrically conductive connection between opposite surfaces of an electrically insulating matrix constituted of a material susceptible to dissocation by heat comprising the steps of:

(a) heating a localized portion of said matrix to cause said matrix to dissociate in said localized portion, (b) maintaining heat on said localized portion for a period of time sufficient for vaporizing at least one volatile constituent from said localized portion, thereby causing a hole to be propagated through the thickness of said matrix and to cause the wall of said hole to become coated with the less volatile constituent of said matrix, and (c) thereafter at least partially refilling said hole with an electrically conductive material.

References Cited

UNITED STATES PATENTS

| | | | |
|---|---|---|---|
| 3,080,481 | 3/1963 | Robinson. | |
| 3,102,213 | 8/1963 | Bedson | 29—155.5 X |
| 3,171,762 | 3/1965 | Rutz | 148—1.5 X |
| 3,178,804 | 4/1965 | Ullery | 29—155.5 |
| 3,179,542 | 4/1965 | Quinn | 148—177 |
| 3,258,898 | 7/1966 | Garibotti | 29—155.5 |

WILLIAM I. BROOKS, *Primary Examiner.*